Sept. 20, 1960 M. L. SCHULTZ 2,953,621
PHOTOVOLTAIC APPARATUS
Original Filed May 23, 1950
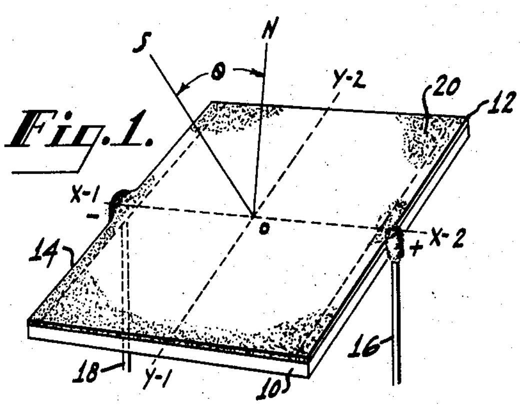
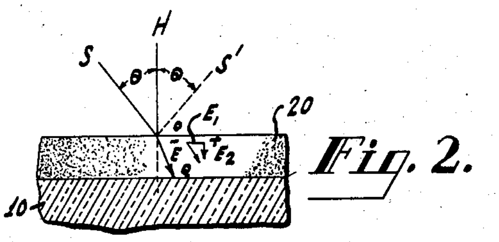
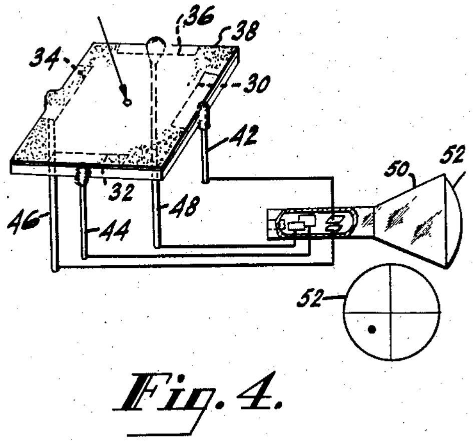
FIG. 4.
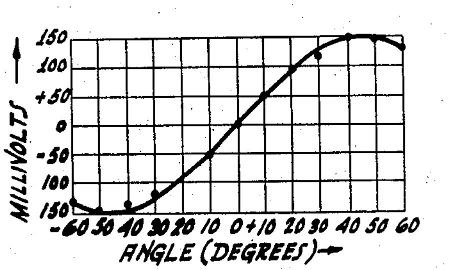
FIG. 3.
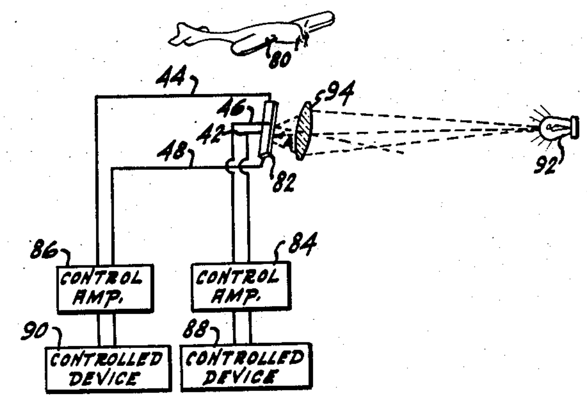
FIG. 5.
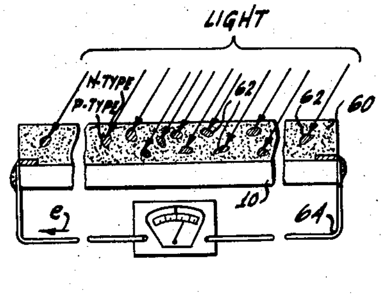
FIG. 6.
INVENTOR.
MELVIN L. SCHULTZ
BY
W. S. Hill
AGENT United States Patent Office 2,953,621

Patented Sept. 20, 1960

2,953,621

PHOTOVOLTAIC APPARATUS

Melvin L. Schultz, Princeton, N.J., assignor to Radio Corporation of America, a corporation of Delaware Original application May 23, 1950, Ser. No. 163,683, now Patent No. 2,877,284, dated Mar. 10, 1958. Divided and this application Jan. 12, 1959, Ser. No. 786,256

3 Claims. (Cl. 136—89)

This application is a division of application Serial No. 163,683 filed May 23, 1950 now Patent No. 2,877,284.

This invention relates to photoelectricity and more particularly to photovoltaic effects.

Photovoltaic effects heretofore known, such as those between metal and semi-conductors, are non-directional or non-sensing with respect to the angle of incidence of the light. Photovoltaic effects are also known, for example, the Dember effect, in which the polarity displayed depends upon that portion of a crystal on which light falls. Again, photovoltaic effects are known in which a voltage is generated by a crystal so long as the entire crystal is illuminated, but the effect fails or substantially fails when a portion of the crystal is dark. The photovoltaic cell of the invention is distinctive in that substantially any portion of the cell between electrodes may be illuminated, the response being dependent upon the direction of incidence of the light, and upon the intensity thereof, substantially without regard to whether or not only a particular portion of the area of the cell is illuminated.

It is an object of the present invention to provide a new and improved photovoltaic cell.

It is a further object of the invention to provide a photovoltaic cell having novel directional and sensing properties.

It is another object of the invention to provide methods of manufacturing such new and novel photovoltaic cells.

A further object of the invention is to provide new and novel apparatus in which the photovoltaic cell of the invention is employed.

The foregoing objects, advantages, and novel features of the invention will be more apparent from the following description when read in connection with the accompanying drawings in which like reference numerals refer to like parts and in which:

Fig. 1 is a perspective view of a photovoltaic cell in accordance with the invention;

Fig. 2 is a cross-sectional view of a portion of the cell of Fig. 1;

Fig. 3 is a curve showing the response of the cell of Fig. 1;

Fig. 4 is another perspective view of a photovoltaic cell constructed in accordance with the invention, together with a circuit employing the cell; and Fig. 5 is an illustration of apparatus employing a cell according to Fig. 4, and Fig. 6 is a cross-section view of a portion of one type of cell prepared in accordance with the present invention and connected in an external circuit, the film thickness of the cell being exaggerated.

In accordance with the present invention, I provide a photovoltaic cell which generates a voltage in response to incident light. I have discovered that such cells may be made which not only consistently produce the desired photovoltaic effect but also have highly valuable directional properties not possessed by other photovoltaic cells. In particular, the photovoltaic cell of the invention has a light-sensitive surface layer, the elements of which generate a direct-current voltage, the polarity and magnitude of which may be represented as a component, in the surface at the element upon which the light is incident, of a vector having the magnitude and direction of the incident light. Therefore, the generated voltage may be considered as having sensing and direction. The voltages generated in the cell of the invention may be utilized in a combination in which the cell is connected to a controlled device responsive in one sense to voltages of one polarity and responsive in another sense to voltages of the opposite polarity. This novel combination dispenses with the necessity of utilizing complicated light sensitive elements in light-seeking instruments, as will be more fully apparent hereinafter.

It will be understood that, throughout the specification and claims, the term photovoltaic cell refers to a cell which generates a voltage in response to incident light.

Referring now more particularly to Fig. 1, there is shown a photovoltaic cell of the invention in which one major surface of a rectangular glass plate 10 has coated thereon spaced silver electrodes 12 and 14 on opposite sides thereof respectively with leads 16 and 18, respectively, from the electrodes 12 and 14. A surface coating 20 upon the glass plate 10 has unique properties, which will be described in connection with Fig. 3. Referring to Fig. 2, as well as to Fig. 1, let a normal N—O be erected on the surface of the surface layer 20. Let incident light be directed in the direction of the arrow S toward the point O at which the normal is erected. Some of the incident light directed along the line S—O will enter the substance 20, being refracted so that it is directed along the line O—Q. Let the light entering the surface layer 20 at the point O be represented by a vector E which has a length proportional to the light intensity and a direction parallel to O—Q. The vector E may be resolved into two components, one, $E_1$, being parallel to the surface of the layer 20 and the other, $E_2$, being normal to $E_1$. The present invention is based upon the discovery that, with certain materials or classes of materials forming the surface layer 20, a voltage is induced or generated in the surface layer 20, which voltage is substantially proportional both in direction and amplitude to the vector $E_1$. Thus, if the incident light, instead of being directed along the line S—O should be redirected along the line S′—O so that the angle of incidence is the negative of $\theta$, then the vector $E_1$ is reversed in direction and the polarity of the generated voltage is similarly reversed. It will be assumed for the present that the direction of incident light is in the plane through the line X-1, X-2 and through the normal N—O. If light should be incident on the surface in some different plane, then the vectorial component lying in the plane connecting the electrodes may be considered as representative of the voltage generated between the two electrodes. It will be understood that the entire surface may be divided into small elemental surface areas and the surface layer divided into corresponding small elemental surface layer elements, each of which has an exposed surface which is sufficiently small to be considered substantially planar and on which the normal O—N may be erected. The voltages represented by the vector $E_1$ may be then summed through the layer vectorially to give substantially the voltage generated between any two electrodes contacting the surface layer. From the geometry of the arrangement and from the behavior of the surface layer heretofore explained, the following expression for the magnitude of $E_1$ may be readily derived:

$$E_1 = kI_0(1-b)\cos\phi\cos\theta\tan\left(\arcsin\frac{\sin\theta}{n}\right) \quad (1)$$

In the equation, $k$ is a proportionality constant, $I_0$ is the incident light intensity, $b$ is the fraction of the incident radiation reflected at the interface between the surface layer 20 and the surface of the surrounding medium, $\phi$ is the angle of the plane of incidence with the normal plane between the electrodes (e.g., the plane X–1, N, X–2 of Fig. 1), $\theta$ is the angle between the incident ray and the normal to the surface, and $n$ is the effective refractive index of the layer with respect to the surrounding medium. The variation of $b$ with $\theta$ may be neglected and if $I_0$ is assumed to have some fixed value, Equation 1 may be written:

$$E_1 = K \cos\phi \cos\theta \tan\left(\arcsin \frac{\sin\theta}{n}\right) \qquad (2)$$

The curve of Fig. 3 shows the response of a particular cell such as that illustrated in Fig. 1 for light of varying angles of incidence in the normal plane between the two electrodes 12 and 14 in which the constants $k$ and $n$ have been determined from experimental data. The close fit of the response curve to the data is obvious, the points derived experimentally being indicated by the small circles on the graph of Fig. 3. This data was derived for $\phi$ equal to zero. Referring now more particularly to Fig. 4, there is illustrated another photovoltaic cell in accordance with the invention having, however, four electrodes 30, 32, 34, and 36. A surface layer 38 is provided on a glass plate 40, the electrodes 30, 32, 34, and 36 being in contact with the surface layer. The voltages generated between the respective electrodes may be determined, as before, by considering that the light incident at a surface element enters the surface layer and is refracted in accordance with the appropriate index of refraction. The voltage generated in a direction along the surface of the surface layer may be vectorially represented as a vector component proportional to the vector component of the light which entered the surface layer. Thus, the electrodes 30, 32, 34, 36 may be placed with any desired angular distribution about the plate 40, or one of the electrodes may be omitted and the others distributed at equal angular intervals about the plate 40. The plate may be of a different shape, such as circular. The voltages generated by light incident on the surface layer 38 between the various electrodes may be readily computed in accordance with the foregoing principles. Each pair of electrodes will have a voltage generated therebetween which may be considered independently of the others. For example, in Fig. 4, the voltages generated between electrodes 30 and 34 may be considered as independent of the voltages generated between electrodes 32 and 36. This four electrode photovoltaic cell behaves exactly as though one had two independent cells of the type of Fig. 1 with electrodes oriented in lines at right angles to each other. Observation of the sign and magnitude of the response of both pairs of electrodes permits a determination of the angle of incidence of light upon the surface of surface layer 38. A convenient method of presenting such information can be carried out, for example, by connecting each pair of electrodes to one of the pairs of deflecting plates of an ordinary direct current oscilloscope 50, having a viewing screen 52. The coordinates of the spot on the oscilloscope screen indicate the quadrant from which the light is being directed, considering four space quadrants formed by two planes normal to each other and normal to the electrodes, the quadrants being the space quadrants formed between these planes and the planar surface 38. Furthermore, if a standard light source of known intensity is used, the distance of the spot from the center of the screen will be proportional to the angle of incidence of the light with respect to a normal to the surface of the cell. The rate of change of the generated voltages with respect to the angle $\theta$ is a maximum at normal incidence as will be apparent from Fig. 2 and from the equations. This rate of change of generated voltage for the angle $\theta$ remains, however, substantially constant over a total angle of some 60 or 80 degrees.

The cell of the invention may be used to orient a moving body with respect to a distant light source, or, similarly, to orient the cell with respect to the position of a distant light source. An example is illustrated by Fig. 5 in which an airplane 80 may carry a photovoltaic cell 82 which may be the same as the cell illustrated in Fig. 4. The leads 42, 44, 46, and 48, respectively, lead from electrodes 30, 32, 34, and 36. The leads 42 and 46 are connected to a control amplifier 84 and the leads 44—48 are connected to a control amplifier 86. The amplifiers 84 and 86 are connected, respectively, to controlled devices 88 and 90. The controlled devices may, for example, actuate the aileron and rudder of airplane 80 to orient the plane so as to point it toward the distant light source 92 to which the photovoltaic cell 82 is exposed through a lens 94. The direction of incident light is indicated by an arrow A. If desired, the control device may be such as to reorient the cell so that its surface is in some desired relationship to the light 92. If the light 92 is the familiar beacon type which rotates at a fixed speed, it will be apparent that a pulsating potential will be generated on the paired leads 42—46 and 44—48 and the amplifiers may be of the alternating current type, with suitable sensing. In any event, the controlled device may be operated in servo-mechanism fashion to orient the cell 82, to bring the various voltages to a minimum which will, of course, occur when the cell is oriented with respect to light source 92 so that the light incident on the cell falls normal to the surface thereof.

In order to explain methods of preparation of the photovoltaic cells of Fig. 1 or Fig. 4, an example will now be given.

*Example*

A glass plate similar to the plate 10 of Fig. 1 may have applied thereto a pair of electrodes positioned such as electrodes 12 and 14 of Fig. 1, or two pairs of electrodes such as 30, 32, 34, and 36 of Fig. 3. These electrodes may be made, for example, of colloidal graphite or a thin, transparent, electrically conducting film of stannic oxide. The electrodes are provided with suitable leads and the plate thus prepared is placed in a vacuum chamber. Lead sulphide or lead selenide and lead oxide are then evaporated simultaneously under high vacuum conditions, and deposited on the surface of the plate 10. A preferred pressure is about $10^{-5}$ mm. of mercury although no difficulties are experienced with somewhat higher pressures up to about $10^{-3}$ mm. of mercury. The lead sulphide or lead selenide may conveniently be evaporated from a small tantalum cup set in a basket of tungsten wire. The tungsten wire is the heating element. The lead oxide may be evaporated from a small platinum cup. Relatively small quantities of lead oxide in proportion to the lead sulphide or selenide are preferred. Proportions of lead oxide to lead sulphide or selenide have been used ranging from about 1 to 30% by weight. The best results, however, have been achieved with a range of proportion of lead oxide to lead sulphide or selenide of about 5 to 15%. The preferred thickness of the deposited film is about 1 micron although this does not appear to be too critical. Film thickness of about 0.3 or 0.4 micron to 2 microns have been found to be operative, for example. If the film is too thick, mechanical difficulties of uniform deposition are experienced and activation may be non-uniform.

After the simultaneous deposition of the film of lead oxide in lead sulphide or selenide the film is activated. The activation treatment preferably comprises heating in air or oxygen for from 5 to 20 minutes within a range of temperature of about 400° to 475° C.

In the above example, it is not necessary to use a glass plate as the supporting base. Any heat-resistant electrically insulating material may be used such as some other ceramic or mica. Since the base plate serves only as a convenient supporting means for the film, it may be dispensed with entirely where self supporting films can be used.

Based on all the data that have been accumulated, the following is presented as an explanation and a generalization of the mechanism of the observed phenomena. Fig. 6 is illustrative. In all cases observed, there appears to be present a matrix 60 of a semi-conductive material which has photoconductive properties and is substantially transparent to the light which is to be utilized. Embedded in the matrix, there are either actual discrete particles 62, or their equivalent, of another photoconductive semiconductor which is substantially less transparent to passage therethrough of the light. The two semi-conductors must be of opposite types: that is, if the matrix 60 is P-type, the embedded particles 62 must be N-type, and vice-versa.

The photovoltaic effect apparently originates at the boundary of the two materials. The barrier at which the photo-E.M.F. is generated arises because of the dissimilar character of the two materials with respect to their type of semi-conduction; i.e., N or P.

When illumination is from a direction normal to the surface of a prepared cell, all sides of the embedded particles (with respect to the edges of the film deposited on the base plate) receive substantially equal intensities of light. But when illumination is from a direction which is at an angle with the normal to the surface of the film, as shown by the arrows of Fig. 6, the side of each embedded particle toward the direction of illumination will receive more light than the side which is turned away from the direction of illumination.

The cell which was described in the example comprises particles of PbO embedded in a film of PbS or PbSe. If the PbO is made a P-type and the PbS is made an N-type semiconductor, when light falls on the boundary between the two materials, the N-type becomes negatively charged and the P-type becomes positively charged. If a conductor 64 is then connected between two ends of the film, a current will flow such that electrons travel from the N-type to the P-type material.

In the cell described in the example, the sign or polarity of the generated voltage is such that electron flow in the external circuit is in the direction toward the electrode toward which the light is directed and away from the other electrode. Thus, if the mechanism for the generated voltage were on the basis of electron flow, the electron flow within the cell would be away from that electrode toward which the light is pointed in its incidence. In short, the electrode toward which the light is directed, for example, the electrode 12 of Fig. 1, or the left hand electrode of Fig. 6, with the light incident along the line S—O is the positive electrode and the electrode 14 is the negative electrode. If a resistor (not shown) is connected between leads 16 and 18, the electron flow will be from the electrode 14 and lead 18 through the resistor to the lead 16 and electrode 12.

The above conditions for predicting the polarity of a cell apply only when the matrix is an N-type semi-conductor and the embedded material is a P-type semi-conductor. Where the embedded material is N-type and the matrix is P-type, the polarity will be reversed.

It has been pointed out above that, as the angle $\theta$ of the incident beam with respect to the normal increases, the potential increases to a maximum, which occurs at an angle of about 45° for the examples studied, and then decreases. This generally applies to all cases but, in any individual case, the potential will also be dependent upon other secondary factors such as the shape of the embedded particles, the index of refraction of the film and the dependence of the reflectivity of the material upon angle of incidence of the light. Since the fraction of the incident beam which is reflected increases with increasing value of $\theta$, this probably explains why the E.M.F. increases from zero, passes through a maximum, and then decreases as $\theta$ is increased from zero to 90°.

The voltage generated in the cell described in the example may be as high as 33 millivolts per lumen, with the entire activated cell surface illuminated, at an angle of incidence of 45 degrees in a cell such as that illustrated in Fig. 1 and with the plane of incidence parallel to the lines of the electrodes 12—14. The photovoltaic cells so far described are receptive to infra-red radiation although not to the same degree as for white light. After preparation and activation of the cells herein described, there is a small decrease of sensitivity over the course of a day or two. After this initial decrease of sensitivity, the cells will retain their sensitivity for an indeterminate period and may be considered stable in response. They need not be placed in vacuum and are quite rugged, although exposure to the hazards of the weather is not recommended. The response of the cell, of course, is dependent upon the total illumination falling upon the cell. It is substantially independent over a wide range of values of the area over which the illumination falls.

The novel photovoltaic cell of the present invention has many practical applications in addition to that previously described. It can be used, for example, as an out-of-balance indicator in an electrically operated, automatic chemical balance since a fixed light source can be utilized to direct a beam of light on the cell and any deviation from the position of balance will be indicated as a potential having a magnitude proportional to the degree of unbalance and a sign which corresponds to the direction of unbalance. If the direction of unbalance is always the same, the magnitude of the potential, alone, can be utilized as the control means.

Another related application is that of detecting the amount of deflection of a galvanometer coil, the cell being mounted on the galvanometer suspension. Sensitivity, using a cell of this type, can be shown to be considerably higher than in a conventional deflection indicator which comprises a mirror mounted on the galvanometer suspension, a light source to direct a focused beam of light to the mirror, and a scale which is at a distance of one meter from the galvanometer.

Another application of the cell of the present invention is a detecting element in a phonographic pickup. The cell is rigidly connected to the stylus and thus follows its movements as the stylus follows a sound groove. A beam of light from an adjacent source is continuously directed on the cell. The output potential of the cell is proportional to the amplitude of vibration and can be amplified and fed to suitable reproducing apparatus, such as a speaker.

Still other applications of interest include a deviation detector in an automatic pilot for aircraft or ships, a control element for a heliostat, and a means for detecting and indicating differences of pressure to which a Bourdon type gauge is responding.

Obviously, many other practical applications of the device of the present invention are also possible. In general, these devices include the same basic elements of apparatus illustrated in Fig. 5 although they will, of course, differ in detail.

What is claimed is:

1. A directionally sensitive photovoltaic cell comprising a supporting base of electrically insulating, heat resistant material, said base having a surface provided with a film comprising a material from the class consisting of PbS and PbSe, mixed with about 10 to about 30 weight percent PbO, said film having been activated by heating said mixture in the presence of oxygen for from about 5 to about 20 minutes at a temperature within the range of about 400° to 475° C.

2. A cell according to claim 1 including at least one pair of electrodes in electrical contact with said film.

3. A method of making a directionally sensitive photovoltaic cell comprising placing on a surface of a base plate of heat-resistant electrically insulating material, at least one pair of spaced apart electrodes, depositing on said surface and over said electrodes, by thermal evaporation in vacuo a coating comprising a mixture of a material from the class consisting of PbS and PbSe with from 10 to 30 weight percent PbO, and activating said coating by heating in the presence of oxygen for from about 5 to 20 minutes at a temperature within the range of about 400° to 475° C.

No references cited.